US008994407B1

United States Patent
Cheng et al.

(10) Patent No.: US 8,994,407 B1
(45) Date of Patent: Mar. 31, 2015

(54) METHOD AND SYSTEM FOR REMOVING A PULSE HAVING A DIFFERENT PULSE WIDTH RELATIVE TO THAT OF OTHER PULSES IN A CLOCK SIGNAL OF AN ANALOG TO DIGITAL CONVERTER

(71) Applicant: Marvell International Ltd., Hamilton (BM)

(72) Inventors: Chi Fung Cheng, San Jose, CA (US); Pantas Sutardja, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/051,614

(22) Filed: Oct. 11, 2013

Related U.S. Application Data

(60) Continuation of application No. 13/686,424, filed on Nov. 27, 2012, now Pat. No. 8,558,580, which is a division of application No. 10/752,785, filed on Jan. 5, 2004, now Pat. No. 8,319,524.

(51) Int. Cl.
  *G01R 29/02* (2006.01)
  *H03K 9/08* (2006.01)
  *H03K 5/156* (2006.01)
(52) U.S. Cl.
  CPC ..................................... *H03K 5/156* (2013.01)
  USPC .............................................. 327/34; 327/99
(58) Field of Classification Search
  USPC ....................................................... 327/34, 99
  See application file for complete search history.

(56) References Cited

U.S. PATENT DOCUMENTS

| | | | |
|---|---|---|---|
| 3,564,285 A * | 2/1971 | Gilbert ............................ 327/34 |
| 4,216,388 A | 8/1980 | Wilson | |
| 4,471,235 A | 9/1984 | Sakhuja et al. | |
| 4,596,939 A | 6/1986 | Yamada | |
| 4,775,840 A * | 10/1988 | Ohmori et al. .................. 327/34 |
| 4,857,760 A * | 8/1989 | Stuebing ......................... 327/31 |
| 5,001,374 A * | 3/1991 | Chang ............................ 327/552 |
| 5,151,612 A | 9/1992 | Ishikawa | |
| 5,604,452 A * | 2/1997 | Huang ............................. 327/99 |
| 5,815,030 A | 9/1998 | Wuidart et al. | |
| 5,815,690 A | 9/1998 | Kowert et al. | |
| 6,075,473 A | 6/2000 | Masuda | |
| 6,134,252 A * | 10/2000 | Aspacio et al. ................. 372/34 |
| 6,246,213 B1 * | 6/2001 | Meador et al. ................ 320/135 |
| 6,304,199 B1 | 10/2001 | Fang et al. | |
| 6,507,221 B2 | 1/2003 | La Rosa | |
| 6,535,024 B1 | 3/2003 | Rochart | |
| 6,535,057 B2 * | 3/2003 | Chakravarthy ............... 327/551 |
| 6,680,637 B2 | 1/2004 | Seo | |
| 6,778,111 B1 * | 8/2004 | Zhu et al. ...................... 341/134 |
| 7,187,213 B2 | 3/2007 | Yoshida et al. | |
| 8,319,524 B1 | 11/2012 | Cheng et al. | |

* cited by examiner

Primary Examiner — Kenneth B. Wells

(57) ABSTRACT

A system includes an ADC that, based on a first clock signal, converts an analog signal into a digital signal. A first circuit generates a second clock signal based on the digital signal. An interpolator generates a phase delayed version of the second clock signal and a third clock signal. The third clock signal is generated based on the second clock signal and the phase delayed version and includes transitioning from the second clock signal to the phase delayed version. The third clock signal includes pulses each having a first pulse width and a pulse having a second pulse width. The second pulse width is different than the first pulse width due to the transition from the second clock signal to the third clock signal. A second circuit removes the pulse having the second pulse width from the third clock signal to generate the first clock signal.

19 Claims, 7 Drawing Sheets

METHOD AND SYSTEM FOR REMOVING A PULSE HAVING A DIFFERENT PULSE WIDTH RELATIVE TO THAT OF OTHER PULSES IN A CLOCK SIGNAL OF AN ANALOG TO DIGITAL CONVERTER

CROSS-REFERENCE TO RELATED APPLICATIONS

The present disclosure is a continuation of U.S. patent application Ser. No. 13/686,424 (now U.S. Pat. No. 8,558,580), filed Nov. 27, 2012 which is a divisional of U.S. patent application Ser. No. 10/752,785 (now U.S. Pat. No. 8,319,524), filed on Jan. 5, 2004. The entire disclosures of the applications referenced above are incorporated herein by reference.

FIELD

This disclosure relates in general to the field of information storage, and more particularly to the acquisition of timing signals in a read channel.

BACKGROUND

Many systems using digital data need to convert an analog signal to digital data for further use. Converting analog data to digital data may require a clock synchronized with the analog data.

Often, in data communication or transmission systems, data is formatted with timing information which may be retrieved in order to establish a clock that has the same frequency and phase offset as the data. The schematic block diagram shown in FIG. 1 is one way in which the clock may be synchronized with the data. ADC 101 receives a signal from the transducing head and a clock signal from interpolator 103 for converting the analog signal from the transducing head to a digital signal. The ADC 101 provides a signal to the timing loop control 102, which in turn provides an adjusted clock to the interpolator 103.

FIG. 2 shows one schematic representation of the interpolator 103. The adjusted clock, CLK A, provides an input to a phase delay circuit 201. A second clock, CLK B, is generated having the same frequency as CLK A but with a fixed phase delay or offset of between 0 and $\pi/2$. Each CLK A and CLK B also provide inputs to a selection circuit 202, which determines when to switch from CLK A to CLK B and directs a multiplexer 203 to provide either CLK A or CLK B as the reference clock.

FIG. 3 shows the relation between CLK A and CLK B. The phase offset is depicted as $\pi/2$, although the phase offset may be any value between 0 and $\pi/2$. When the selection circuit switches from CLK A to CLKB, a "glitch," which is an unwanted pulse of a short duration that interferes with the operation of process circuitry such as the ADC, may occur. The switching between CLK A and CLK B may occur at any time during either clock cycle. As a result, sometimes a glitch may occur, but sometimes not.

Looking at this phenomenon in a little more detail, the interpolator 103 provides a reference clock based upon either CLK A or CLK B. The reference clock is high when the clock from which it is based is high. For example, if the transition occurs when CLK A is low and CLK B is high, the reference clock also goes high for the remainder of the CLK B cycle, thereby generating a glitch. Likewise, if the transition occurs when CLK A is high and CLK B is low, the reference clock also goes high for the remainder of the CLK A cycle, and once again, a glitch will result. If the transition occurs when CLK A and CLK B are both either high or low, no glitch is produced. A desired reference clock signal having a transition from CLK A to CLK B does not have pulses of short duration (glitches), but instead lengthens the cycle in which the transition occurs.

Therefore, a need exists for a circuit to remove glitches from a clock signal, to improve the operational reliability of subsequent circuits which depend on a stable clock signal.

SUMMARY

A system is provided and includes an analog to digital converter, a first circuit, an interpolator, and a second circuit. The analog to digital converter is configured to, based on a first clock signal, convert an analog signal into a digital signal. The first circuit is configured to generate a second clock signal based on the digital signal. The interpolator is configured to: generate a phase delayed version of the second clock signal; and generate a third clock signal based on (i) the second clock signal, and (ii) the phase delayed version of the second clock signal. The generating of the third clock signal includes transitioning from the second clock signal to the phase delayed version of the second clock signal. The third clock signal includes (i) first pulses each having a first pulse width, and (ii) a pulse having a second pulse width. The second pulse width is different than the first pulse width due to the transition from the second clock signal to the third clock signal. The second circuit is configured to remove the pulse having the second pulse width from the third clock signal to generate the first clock signal.

In other features, a method is provided and includes: based on a first clock signal, converting an analog signal into a digital signal; generating a second clock signal based on the digital signal; generating a phase delayed version of the second clock signal; and generating a third clock signal based on (i) the second clock signal, and (ii) the phase delayed version of the second clock signal. The generating of third clock signal includes transitioning from the second clock signal to the phase delayed version of the second clock signal. The third clock signal includes (i) first pulses each having a first pulse width, and (ii) a pulse having a second pulse width. The second pulse width is different than the first pulse width due to the transition from the second clock signal to the third clock signal. The pulse having the second pulse width is removed from the third clock signal to generate the first clock signal.

A data channel circuit is provided and includes an analog to digital converter, a timing loop control circuit, an interpolator circuit, and a deglitch circuit. The analog to digital converter is configured to convert an analog input signal into a corresponding digital signal in accordance with a reference clock signal received from a timing loop. The timing loop control circuit is configured to (i) receive the digital signal from the analog to digital converter, and (ii) generate a first clock signal based on the digital signal. The interpolator circuit is configured to receive the first clock signal, and generate a second clock signal based on (i) the first clock signal, and (ii) the first clock signal delayed by a predetermined phase delay. The second clock signal has first glitches. The deglitch circuit is configured to, based on the second clock signal, generate the reference clock signal. The reference clock signal does not include the first glitches.

In other features, a data channel circuit is provided and includes an analog to digital converter, a timing loop control circuit, an interpolator circuit, and a deglitch circuit. The analog to digital converter is configured to convert an analog input signal into a corresponding digital signal in accordance with a reference clock signal received from a timing loop. The timing loop control circuit is configured to (i) receive the digital signal from the analog to digital converter, and (ii) generate a first clock signal based on the digital signal. The first clock signal has pulses of a predetermined duration. The interpolator circuit is configured to (i) receive the first clock signal, and (ii) generate a second clock signal based on the first clock signal. The second clock signal has first glitches. The first glitches include pulses of a shorter duration than the predetermined duration. The deglitch circuit is configured to (i) receive the second clock signal, and (ii) based on the second clock signal, generate the reference clock signal. The reference clock signal does not include the first glitches. The deglitch circuit includes a locked loop and is configured to (i) establish a first duty cycle based on the second clock signal, and (ii) provide feedback for the locked loop based on the first duty cycle.

To address the stated need and fulfill other desired objectives, in accordance with one embodiment, a deglitch circuit provides a digital signal free of short unwanted pulses that may interfere with the timing of dependent circuits. In one embodiment, the deglitch circuit includes a duty cycle lock loop (DCLL) circuit to remove glitches. If necessary, a second DCLL circuit may be provided to restore the input clock duty cycle, though this is not always necessary, particularly where the duty cycle resulting from the first DCLL is acceptable. The DCLL in the inventive deglitch circuit charges a first capacitor at a different rate than discharging the first capacitor in response to an input clock pulse, thereby creating a waveform having an amplitude proportional to the duration of the input clock pulse. An output clock pulse is generated when the amplitude of the waveform exceeds a predetermined threshold, and no pulse is generated when the amplitude fails to exceed the threshold. The output clock pulse may be of a different period than the input clock pulse. The rate of discharge of the first capacitor depends upon the ratio of a second capacitor charge and discharge currents.

DESCRIPTION

Figure 4:
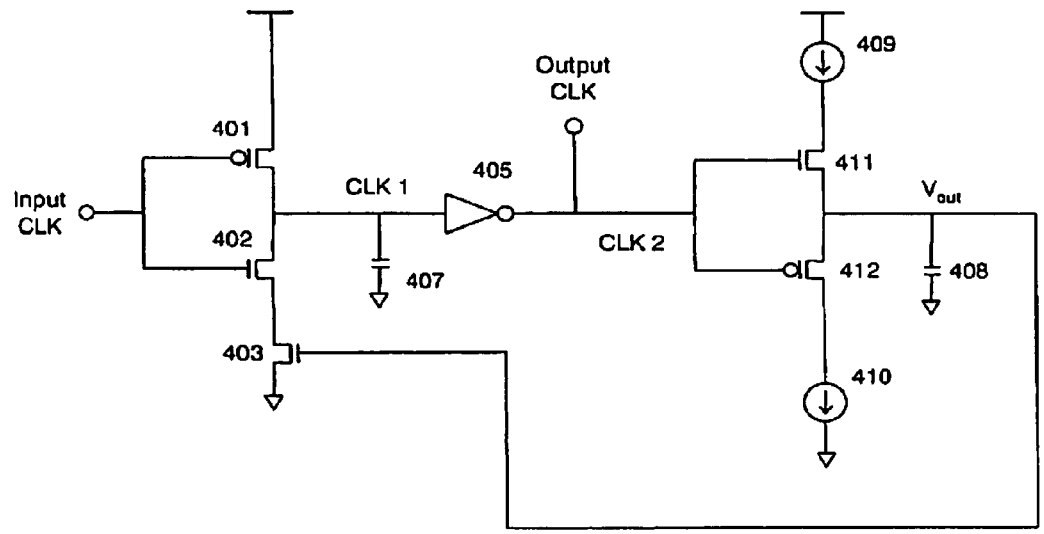
FIG. 4 is one embodiment of the inventive deglitch circuitry.
Figure 5:
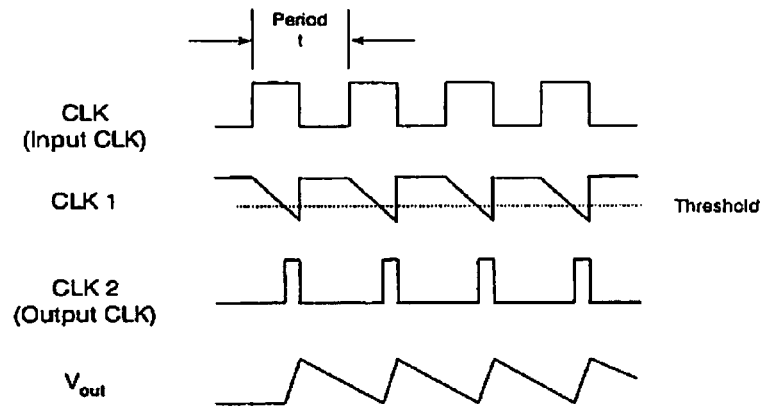
FIG. 5 shows the relationship of an input clock signal, without a glitch, to various signals of the inventive circuitry.

Referring now to FIGS. 4 and 5, the input signal CLK, shown in FIG. 5, has a period of t and a 50-50 duty cycle in which CLK is high for half the cycle, and low for the other half of the cycle. Transistor 401 switches on and transistor 402 switches off when CLK is low. When transistor 401 switches on (CLK is low), capacitor 407 charges rapidly because the amount of current supplied by transistor 401 is not limited. When transistor 401 switches off and transistor 402 switches on (CLK is high), capacitor 407 discharges at a rate controlled by transistor 403, which is biased by the feedback of the DCLL. The resultant signal CLK1, shown in FIG. 5, is inverse to the input signal CLK.

CLK1 is the input to inverter 405, which produces a signal CLK2. Inverter 405 changes state when CLK1 falls below a predetermined threshold, and CLK2 has a duty cycle that is determined by the charging and discharging rates of capacitor 407. CLK2 controls the charging and discharging currents to capacitor 408, thereby producing the voltage $V_{out}$ that is used to bias transistor 403 for controlling the discharge rate of capacitor 407.

CLK2 controls the charging time of capacitor 408 by controlling transistors 411 and 412. Transistor 411 switches on when CLK2 is high, thereby allowing current source 409 to charge capacitor 410. When CLK2 is low, transistor 411 switches off and transistor 412 switches on, allowing capacitor 408 to discharge at a rate determined by current source 410. Each current source 409, 410 may be adjusted to provide a controllable charging or discharging current. The ratio of charging current to discharging current determines the duty cycle of CLK2. For example, a charging current of 4 i and a discharging current of i will produce a 20-80 duty cycle in which CLK2 is high for 1/5 of a cycle and low for 4/5 of a cycle. This duty cycle is controllable depending upon the ratio of charging to discharging currents of capacitor 408.

Figure 6:
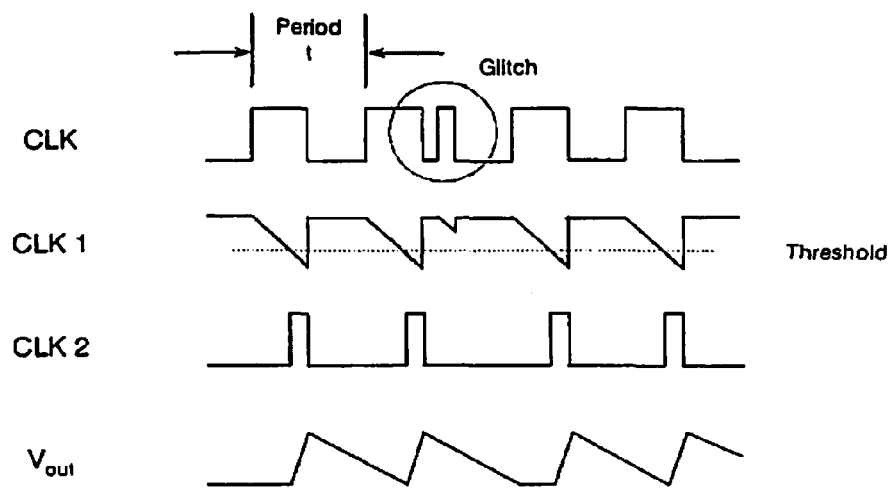
FIG. 6 shows the relationship of an input clock signal, with a glitch, to various signals of the inventive circuitry.

Referring now to FIGS. 4 and 6, a signal having a glitch is applied to the duty cycle lock loop circuit. FIG. 6 shows the clock signal having a glitch in relation to the CLK1, CLK2, and $V_{out}$ signals. When CLK is high, capacitor 407 discharges at a rate set by the bias transistor 403. During the period of the glitch, capacitor 407 does not have the time to discharge sufficiently to reach the threshold at which inverter 405 changes state. Therefore, the inverter 405 does not produce a pulse corresponding to the glitch pulse, and thus CLK2 is "glitch free".

Figure 1:
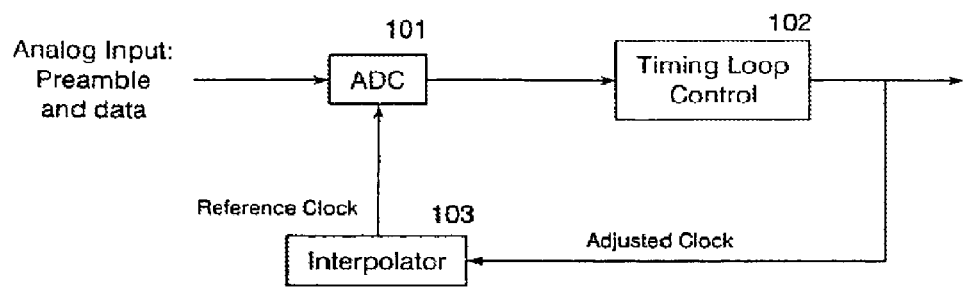
FIG. 1 is a schematic block diagram showing a typical circuit for correcting phase offset of a clock signal.
Figure 2:
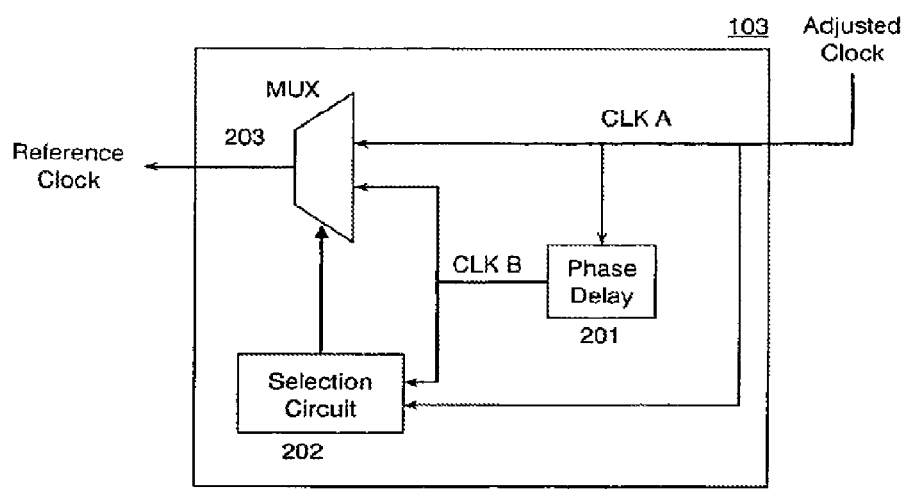
FIG. 2 is a schematic representation of an interpolator used in the circuit of FIG. 1.
Figure 3:
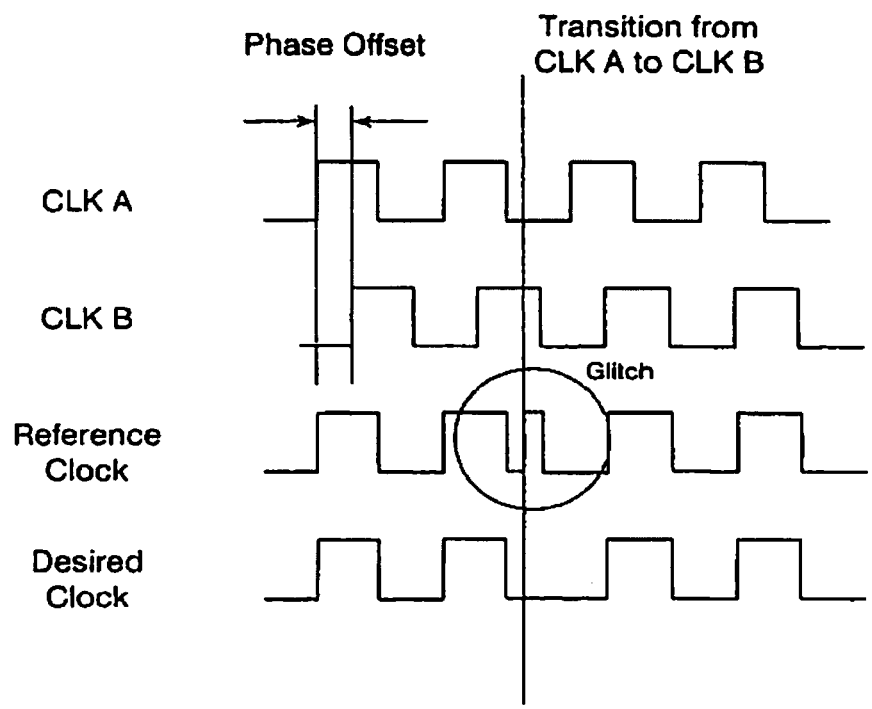
FIG. 3 is a timing diagram showing the relation between a clock signal and a clock signal with a phase offset, where a glitch may be produced depending on when a switch is made from one clock to another clock.

Because the interpolator 203 is configured to provide a reference clock that has a maximum offset of π/2 to the adjusted clock, the maximum duration of a glitch is t/4. Referring to FIG. 3, the reference clock synchronizes with CLK A before the transition to CLK B, and synchronizes with CLK B after the transition. The point at which the reference clock transitions from CLK A to CLK B is a fixed delay, independent of the frequency, with respect the decision to effect the transition. But because the clock period is varying, the transition may occur at a varying percentage of the clock period thereby causing a glitch. Knowing the maximum duration of a glitch is t/4, the ratio of capacitor 408 charging and discharging currents may be selected to ensure that inverter 405 does not change state, thereby eliminating the glitch.

Figure 7:
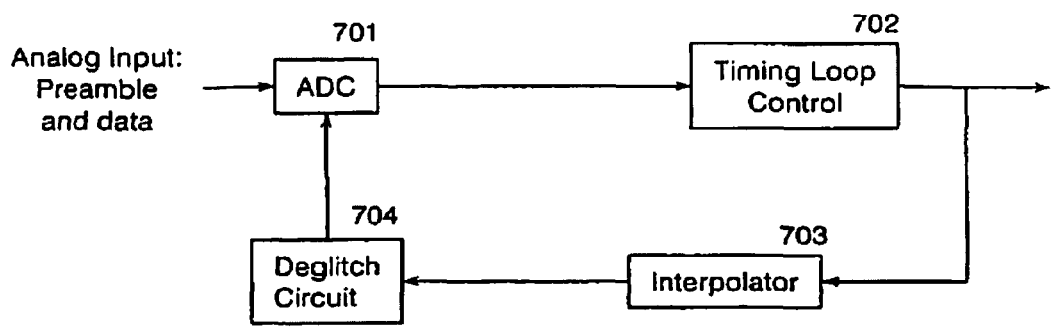
FIG. 7 is a schematic block diagram showing the use of a deglitch circuit in a typical circuit for correcting phase offset of a clock signal.

FIG. 7 shows one implementation of a deglitch circuit 704 to ensure that the clock signal to the analog to digital converter (ADC) 701 is free of glitches. The deglitch circuit 704 may include either one or two DCLL circuits. In one case, a single DCLL circuit may be used, provided that the ADC 701 responds sufficiently to a clock signal having a duty cycle which is the resulting duty cycle of the signal from the first DCLL. In one embodiment, the duty cycle is 20-80, though such a result is not a requirement of operation. If a glitch-free clock having a particular duty cycle is required, the deglitch circuit may include two DCLL circuits coupled in tandem. The first DCLL circuit removes any glitches, while the second DCLL restores the original duty cycle. In order to restore a duty cycle, for example, a 50-50 duty cycle, the charging current and the discharging current for the capacitor 408 of the second DCLL circuit are equal. To restore a different duty cycle, the charging and discharging currents may differ, as would be known to ordinarily skilled artisans. The DCLL circuit also could provide a different duty cycle from that of the input clock signal, if desired.

Figure 8:
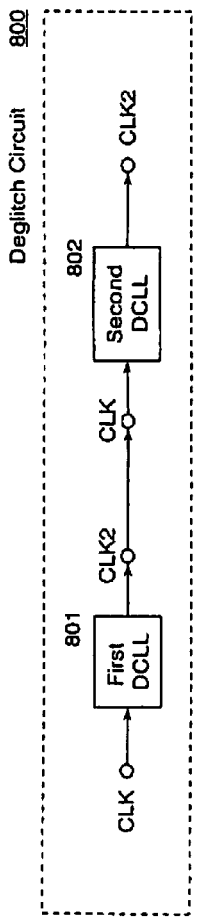
FIG. 8 is a schematic representation of one embodiment of the deglitch circuit showing both a first DCLL circuit and a second, optional DCLL circuit.

FIG. 8 shows a deglitch circuit 800 having a first DCLL circuit 801 and a second, optional DCLL circuit 802 arranged to restore the original duty cycle to a deglitched clock signal.

Figure 9:
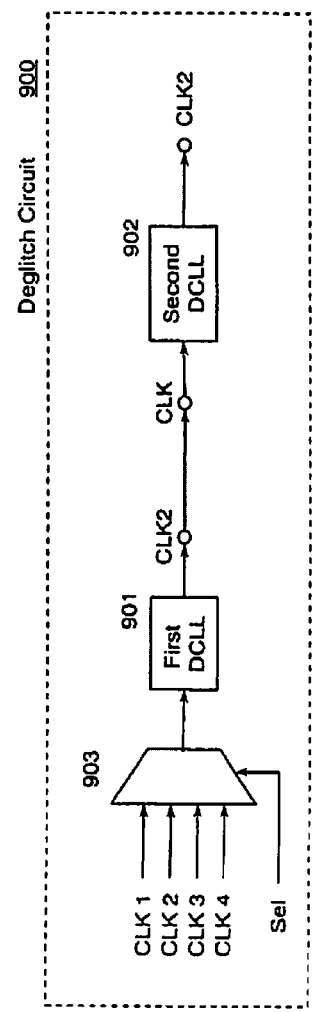
FIG. 9 is another embodiment of the deglitch circuit having a selector for selecting one of multiple different input clock signals.

FIG. 9 shows another embodiment of the inventive deglitch circuit further including a selector for selecting one of multiple input clock signals, each having a different phase offset. A selector signal directs selector 903 to provide one of multiple input clocks to a first DCLL circuit 901 to remove glitches present in the selected input clock signal, or resulting from the selection among different input clock signals. A second DCLL circuit 902 may be coupled to the first DCLL 901, to provide an output clock signal having the duty cycle of the input clock signal. The second DCLL circuit is optional, depending on whether the processing circuitry using the output clock signal requires a clock signal having a particular duty cycle (in one embodiment, a 50-50 duty cycle).

Figure 10:
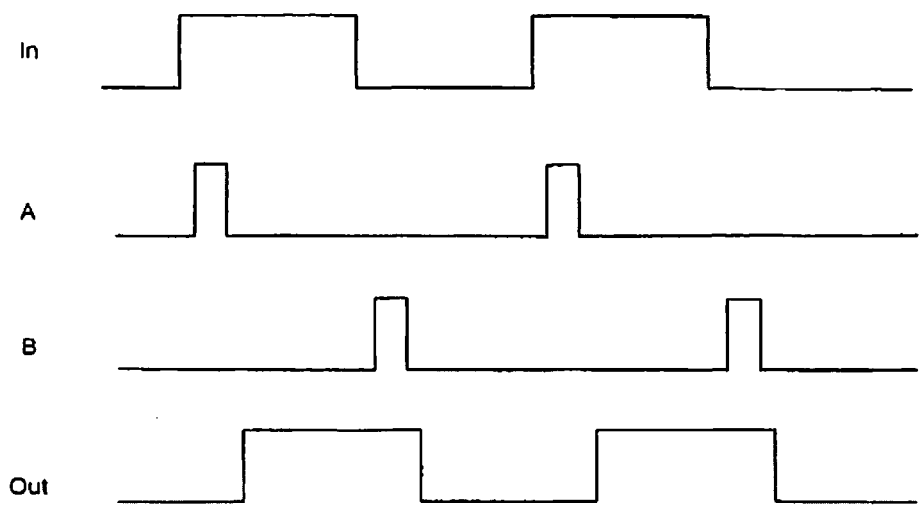
FIG. 10 is a timing diagram showing a relationship among input clock signals and glitches.
Figure 11:
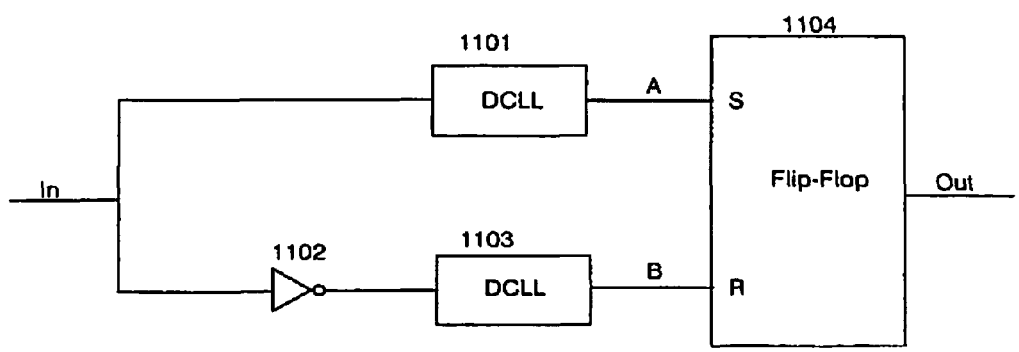
FIG. 11 is a block diagram of another deglitch circuit embodiment.

FIG. 10 shows a timing diagram for a further embodiment (FIG. 11) in which first and second DCLL circuits 1101, 1103, each of which acts as a deglitch circuit in a manner similar to the embodiments of FIGS. 8 and 9, provide signals to the set and reset inputs of a flip-flop 1104. The signal In in FIG. 10 is an input to DCLL circuit 1101; the same signal passes through an inverter 1102, the output of which is an input to DCLL circuit 1103. The input signal In may contain a glitch, such as is shown for example in FIG. 3 or FIG. 6. The output signal A coming from DCLL circuit 1101 is deglitched, as is the output signal B coming from DCLL circuit 1103. The signal Out coming from flip-flop 1104 has the same duty cycle as the input signal In. This way of providing a deglitched signal with the same duty cycle is an alternative to placing two DCLL circuits in series, as in the embodiment of FIG. 8, for example.

The implementations disclosed herein are applicable in a variety of areas, essentially, to any application in which glitches in input clock signals are problematic. One such area is in the field of information storage, including hard disk drive systems (HDD).

In an HDD, data is recorded on magnetic media in tracks, each track having sectors. A sector includes a preamble (for acquiring timing signals), timing bits, a position error field, address bits, data bits, and error correction bits. A read channel uses the preamble to recover the frequency of the recorded data, and creates a clock signal having the same frequency and phase offset as the original data. A circuit is disclosed for a deglitched clock signal synchronized to the data, and is applicable to outputting read channels for HDDs. The implementations disclosed herein are applicable wherever a synchronized clock is required to convert or acquire data.

Figure 12:
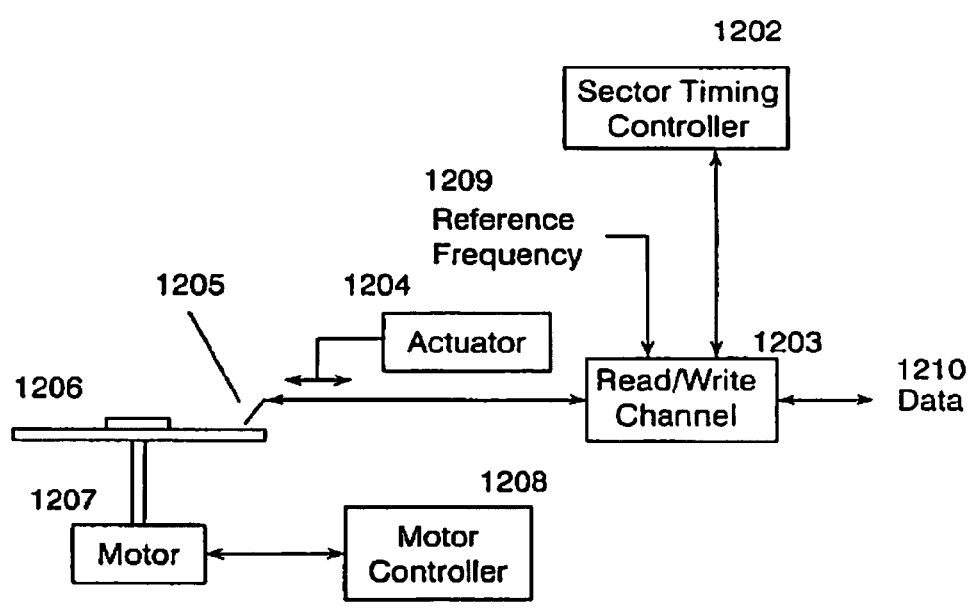
FIG. 12 is a block diagram showing the major components of a typical HDD system.

FIG. 12 shows a schematic representation of a typical HDD, having at least one disk 1206 having a magnetic medium for storing information, a spindle, a motor 1207 and a controller 1208 for controlling disk rotational speed, a transducing head 1205 for reading and writing data, a servo actuator assembly including an actuator 1204 for positioning the head 1205 over the appropriate disk track, and data channels (including read channel 1203) for transmitting data 1210 to and from the disk. The transducing head 1205 reads data from the disk in data blocks over read channel 1203. In switching between reading and writing, for example, glitches can occur in the clock signal. Using the implementations disclosed herein in the read channel 1203 can remove those glitches.

Therefore, the foregoing is illustrative only of the principles of the disclosure. Further, those skilled in the art will recognize that numerous modifications and changes are possible. The disclosure of the foregoing embodiments are not limited to the exact construction and operation shown. Accordingly, all suitable modifications and equivalents fall within the scope of the disclosure.

What is claimed is:

1. A system comprising:
   an analog to digital converter configured to, based on a first clock signal, convert an analog signal into a digital signal;
   a first circuit configured to generate a second clock signal based on the digital signal;
   an interpolator configured to
      generate a phase delayed version of the second clock signal, and
      generate a third clock signal based on (i) the second clock signal, and (ii) the phase delayed version of the second clock signal, wherein
         the generating of the third clock signal includes transitioning from the second clock signal to the phase delayed version of the second clock signal,
         the third clock signal includes (i) a first plurality of clock pulses each having a first pulse width, and (ii) a pulse having a second pulse width, and
         the second pulse width is different than the first pulse width due to the transition from the second clock signal to the phase delayed version of the second clock signal, wherein the pulse having the second pulse width is a portion of a clock pulse of the phase delayed version of the second clock signal; and
   a second circuit configured to remove the pulse having the second pulse width from the third clock signal to generate the first clock signal,
   wherein the second circuit comprises
      a third circuit configured to (i) receive the third clock signal, and (ii) remove the pulse having the second pulse width from the third clock signal to generate a fourth clock signal,
      a fourth circuit configured to (i) receive the third clock signal, and (ii) remove the pulse having the second pulse width from the third clock signal to generate a phase shifted and inverted version of the fourth clock signal, and
      a latch configured to generate the first clock signal based on (i) the fourth clock signal, and (ii) the phase delayed and inverted version of the fourth clock signal.

2. The system of claim 1, wherein each of the clock pulses of the third clock signal, other than the pulse having the second pulse width, has the first pulse width.

3. The system of claim 1, wherein the interpolator comprises a fifth circuit configured to, based on the second clock signal and the phase delayed version of the second clock signal, select the second clock signal or the phase delayed version of the second clock signal.

4. The system of claim 1, wherein:
the third clock signal has a first duty cycle;
the first clock signal has a second duty cycle; and
the second duty cycle is different than the first duty cycle.

5. The system of claim 1, wherein:
the second clock signal has a second plurality of clock pulses; and
each of the second plurality of clock pulses has the first pulse width.

6. The system of claim 1, wherein:
the first clock signal and the third clock signal have a first duty cycle;
the fourth clock signal has a second duty cycle; and
the second duty cycle is different than the first duty cycle.

7. The system of claim 1, wherein:
the second circuit comprises a capacitance; and
removes the pulse having the second pulse width based on (i) a charge rate of the capacitance, or (ii) a discharge rate of the capacitance.

8. A system comprising:
an analog to digital converter configured to, based on a first clock signal, convert an analog signal into a digital signal;
a first circuit configured to generate a second clock signal based on the digital signal;
an interpolator configured to
  generate a phase delayed version of the second clock signal, and
  generate a third clock signal based on (i) the second clock signal, and (ii) the phase delayed version of the second clock signal, wherein
    the generating of the third clock signal includes transitioning from the second clock signal to the phase delayed version of the second clock signal,
    the third clock signal includes (i) a first plurality of pulses each having a first pulse width, and (ii) a pulse having a second pulse width, and
    the second pulse width is different than the first pulse width due to the transition from the second clock signal to the phase delayed version of the second clock signal; and
a second circuit configured to remove the pulse having the second pulse width from the third clock signal to generate the first clock signal,
wherein the second circuit comprises
  a first plurality of transistors comprising a first output,
  a first capacitance configured to be charged based on current received from the first output of the first plurality of transistors,
  wherein the first plurality of transistors are configured to generate an inverted version of the first clock signal based on (i) a charged state of the first capacitance, and (ii) the third clock signal, and
  a first inverter configured to generate the first clock signal based on the inverted version of the first clock signal.

9. The system of claim 8, wherein the second circuit further comprises:
  a second plurality of transistors comprising a second output, wherein the second plurality of transistors are configured to receive the first clock signal and adjust current through the first plurality of transistors; and
  a second capacitance configured to be charged based on current received from the second output of the second plurality of transistors.

10. A system comprising:
an analog to digital converter configured to, based on a first clock signal, convert an analog signal into a digital signal;
a first circuit configured to generate a second clock signal based on the digital signal;
an interpolator configured to
  generate a phase delayed version of the second clock signal, and
  generate a third clock signal based on (i) the second clock signal, and (ii) the phase delayed version of the second clock signal, wherein
    the generating of the third clock signal includes transitioning from the second clock signal to the phase delayed version of the second clock signal,
    the third clock signal includes (i) a first plurality of pulses each having a first pulse width, and (ii) a pulse having a second pulse width, and
    the second pulse width is different than the first pulse width due to the transition from the second clock signal to the phase delayed version of the second clock signal;
a second circuit configured to remove the pulse having the second pulse width from the third clock signal to generate the first clock signal; and
a third circuit comprising
  a first plurality of transistors configured to generate a fourth clock signal based on the third clock signal,
  a first inverter configured to invert the fourth clock signal, wherein the inverted fourth clock signal has a different duty cycle than the third clock signal,
  a second plurality of transistors configured to generate an inverted version of the first clock signal based on the fourth clock signal, and
  a second inverter configured to generate the first clock signal based on the inverted version of the first clock signal, wherein the first clock signal has a same duty cycle as the third clock signal.

11. A system comprising:
an analog to digital converter configured to, based on a first clock signal, convert an analog signal into a digital signal;
a first circuit configured to generate a second clock signal based on the digital signal;
an interpolator configured to
  generate a phase delayed version of the second clock signal, and
  generate a third clock signal based on (i) the second clock signal, and (ii) the phase delayed version of the second clock signal, wherein
    the generating of the third clock signal includes transitioning from the second clock signal to the phase delayed version of the second clock signal,
    the third clock signal includes (i) a first plurality of pulses each having a first pulse width, and (ii) a pulse having a second pulse width, and
    the second pulse width is different than the first pulse width due to the transition from the second clock signal to the phase delayed version of the second clock signal; and
a second circuit configured to remove the pulse having the second pulse width from the third clock signal to generate the first clock signal,
wherein the second circuit comprises
  a first pair of transistors configured to generate an inverted version of the first clock signal based on the third clock signal, an inverter configured to generate the first clock signal based on the inverted version of the first clock signal, a second pair of transistors configured to generate an output signal based on the first clock signal, and a fifth transistor configured to control current through the first pair of transistors based on the output signal from the second pair of transistors.

12. The system of claim 11, wherein:

the first pair of transistors comprise
- a first transistor having an inverting input, wherein the inverting input is configured to receive the third clock signal, and
- a second transistor having a non-inverting input, wherein the non-inverting input is configured to receive the third clock signal; and the second pair of transistors comprise
- a third transistor having a non-inverting input, wherein the non-inverting input of the third transistor is configured to receive the first clock signal, and
- a fourth transistor having an inverting input, wherein the inverting input of the fourth transistor is configured to receive the first clock signal.

13. The system of claim 12, wherein the second circuit comprises:

a first capacitance configured to be charged based on current received from an output of the first pair of transistors, wherein the first pair of transistors are configured to generate the inverted version of the first clock signal based on a charged state of the first capacitance; and a second capacitance configured to be charged based on current received from an output of the second pair of transistors, wherein the second pair of transistors are configured to generate the output signal based on a charged state of the second capacitance.

14. A method comprising:

based on a first clock signal, converting an analog signal into a digital signal;

generating a second clock signal based on the digital signal;

generating a phase delayed version of the second clock signal;

generating a third clock signal based on (i) the second clock signal, and (ii) the phase delayed version of the second clock signal, wherein
- the generating of the third clock signal includes transitioning from the second clock signal to the phase delayed version of the second clock signal,
- the third clock signal includes (i) a first plurality of clock pulses each having a first pulse width, and (ii) a pulse having a second pulse width, and
- the second pulse width is different than the first pulse width due to the transition from the second clock signal to the phase delayed version of the second clock signal, wherein the pulse having the second pulse width is a portion of a clock pulse of the phase delayed version of the second clock signal;

removing the pulse having the second pulse width from the third clock signal to generate the first clock signal;

charging a first capacitance based on current received from a first output of a first plurality of transistors;

generating an inverted version of the first clock signal via the first plurality of transistors based on (i) a charged state of the first capacitance, and (ii) the third clock signal; and inverting the inverted version of the first clock signal to generate the first clock signal.

15. The method of claim 14, wherein each of the clock pulses of the third clock signal, other than the pulse having the second pulse width, has the first pulse width.

16. The method of claim 14, wherein:

the third clock signal has a first duty cycle;

the first clock signal has a second duty cycle; and the second duty cycle is different than the first duty cycle.

17. The method of claim 14, further comprising:

receiving the first clock signal at a second plurality of transistors;

adjusting current through the first plurality of transistors via the second plurality of transistors; and charging a second capacitance based on current received from a second output of the second plurality of transistors.

18. The method of claim 14, further comprising:

removing the pulse having the second pulse width from the third clock signal to generate a fourth clock signal;

removing the pulse having the second pulse width from the third clock signal to generate a phase shifted and inverted version of the fourth clock signal; and generating the first clock signal based on (i) the fourth clock signal, and (ii) the phase delayed and inverted version of the fourth clock signal.

19. A method comprising:

based on a first clock signal, converting an analog signal into a digital signal;

generating a second clock signal based on the digital signal;

generating a phase delayed version of the second clock signal;

generating a third clock signal based on (i) the second clock signal, and (ii) the phase delayed version of the second clock signal, wherein
- the generating of the third clock signal includes transitioning from the second clock signal to the phase delayed version of the second clock signal,
- the third clock signal includes (i) a first plurality of clock pulses each having a first pulse width, and (ii) a pulse having a second pulse width, and
- the second pulse width is different than the first pulse width due to the transition from the second clock signal to the phase delayed version of the second clock signal, wherein the pulse having the second pulse width is a portion of a clock pulse of the phase delayed version of the second clock signal;

removing the pulse having the second pulse width from the third clock signal to generate the first clock signal;

based on the third clock signal, generating a fourth clock signal via a first plurality of transistors;

inverting the fourth clock signal, wherein the inverted fourth clock signal has a different duty cycle than the third clock signal;

based on the fourth clock signal, generating an inverted version of the first clock signal via a second plurality of transistors; and generating the first clock signal based on the inverted version of the first clock signal, wherein the first clock signal has a same duty cycle as the third clock signal.

* * * * *